(12) United States Patent
Hikita et al.

(10) Patent No.: US 6,369,407 B1
(45) Date of Patent: Apr. 9, 2002

(54) SEMICONDUCTOR DEVICE

(75) Inventors: Junichi Hikita; Hiroo Mochida; Kazutaka Shibata, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/500,462

(22) Filed: Feb. 9, 2000

(30) Foreign Application Priority Data

Feb. 9, 1999 (JP) ......................................... H11-031712

(51) Int. Cl.$^7$ ........................... H01L 29/41; H01L 23/58
(52) U.S. Cl. ........................ 257/48; 257/673; 257/777; 257/786; 257/775
(58) Field of Search .................. 257/672, 673, 257/777, 786, 775, 48

(56) References Cited

U.S. PATENT DOCUMENTS 4,951,098 A * 8/1990 Albergo ..................... 257/48
5,726,500 A * 3/1998 Duboz ......................... 438/18
5,891,745 A * 4/1999 Dunaway ................... 438/18
6,008,061 A * 12/1999 Kasai .......................... 257/777

FOREIGN PATENT DOCUMENTS

JP          7-122604          5/1995

* cited by examiner

Primary Examiner—Jerome Jackson, Jr.
(74) Attorney, Agent, or Firm—Arent Fox Kintner Plotkin & Kahn, PLLC

(57) ABSTRACT

A semiconductor device has a semiconductor substrate, an internal circuit formed on the semiconductor substrate, a connection pad formed on the semiconductor substrate and connected to the internal circuit, and a test pad formed on the semiconductor substrate so as to be connected to the connection pad and used for functional testing of the internal circuit. The semiconductor substrate has a bonding region provided on the surface thereof so as to allow another semiconductor substrate to be superposed thereon by being bonded thereto, with the connection pad formed inside the bonding region and the test pad formed outside the bonding region.

9 Claims, 3 Drawing Sheets

SEMICONDUCTOR DEVICE

BACKGROUND OF THE INVENTION

1. Field of the Invention

The present invention relates to a semiconductor device having a semiconductor substrate and having connection pads formed thereon for achieving connection with a semiconductor chip or the like.

2. Description of the Prior Art

In semiconductor devices, to achieve further miniaturization and higher integration density, three-dimensional structures have been proposed to supersede conventional two-dimensional structures. However, forming semiconductor devices having a three-dimensional structure by a continuous process usually results in an unacceptably low yield and involves various difficulties.

To overcome such problems, the inventors of the present invention have been working on a way to commercialize semiconductor devices having a so-called chip-on-chip structure, i.e. a semiconductor device in which a plurality of semiconductor chips are bonded together in a two-layer structure with the surface of a first semiconductor chip laid on the surface of a second semiconductor chip.

To bond a pair of semiconductor chips together, for example, bumps made of an oxidation-resistant metal such as gold are formed on one semiconductor chip. These bumps serve to achieve electrical connection between the electric circuits formed on the two semiconductor chips and simultaneously achieve mechanical bonding between the two semiconductor chips.

FIG. 4 is an enlarged perspective view of the structure of a portion around bumps formed on a semiconductor chip. On the surface 101 of a semiconductor chip 100, i.e. on that side thereof on which an active surface-layer region lies in which transistor and other devices are formed, pads 102 are formed that are connected to the internal circuit (not shown) formed inside the semiconductor chip 100. On these pads 102, bumps 103 made of gold or the like are formed so as to protrude upward. Before the semiconductor chip 100 is assembled with another semiconductor chip by being bonded together, it is singly subjected to a functional test to check its functions. This test is conducted with the tip of a test probe 110 pressed on the bumps 103.

Here, pressing the test probe 110 damages the bumps 103 as indicated by reference symbol A, deforming the surface of the bumps 103 or forming a scooped-out or curled-up portion in the material of the bumps 103. In particular, for example, in cases where the functional test needs to be repeated two or three times under different temperature conditions, the test probe 110 needs to be pressed onto the bumps 103 a plurality of times, and accordingly, when the semiconductor chip 100 has gone through the functional test, the bumps 103 may have suffered considerable damage.

A bump 103 thus damaged cannot secure proper bonding between two semiconductor chips, with the result that the semiconductor chips, when bonded together, suffer from bad contact, making the resulting semiconductor device having a chip-on-chip structure defective as a whole.

Damage to the bumps 103 can be avoided by conducting the functional test before forming the bumps 103. However, in that case, the test probe 110 needs to be pressed onto the pads 102, and thus damage to the pads 102 is inevitable. It is difficult to form a bump 103 properly on a pad 102 thus damaged, with the result that semiconductor chips cannot be bonded together properly. It is possible to form a bump 103 properly even on a damaged pad 102 if the bump 103 is formed as a considerably thick film. However, this requires an extra amount of material and time to form the bump 103, and thus cannot be said to be a desirable solution.

Japanese Laid-Open Patent Application No. H7-122604 proposes providing test pads for the functional testing of a semiconductor chip separately from connection pads. This makes it possible to conduct the functional testing of a semiconductor chip by the use of ordinary testing equipment, and in addition to achieve reliable bonding of metal wires, which contributes to accommodating a larger number of pins.

This prior-art technique helps avoid damage to connection pads, and is thus effective in achieving proper bonding between semiconductor chips. However, within the internal device region, the connection pads occupy an unduly large area, and thus degrade the integration density of the internal devices.

SUMMARY OF THE INVENTION

An object of the present invention is to provide a semiconductor device that permits semiconductor chips that have gone through a functional test to be bonded together properly without sacrificing the integration density of the internal devices.

To achieve the above object, according to the present invention, a semiconductor device is provided with a semiconductor substrate; an internal circuit formed on the semiconductor substrate; a connection pad formed on the semiconductor substrate and connected to the internal circuit; and a test pad formed on the semiconductor substrate so as to be connected to the connection pad and used for functional testing of the internal circuit. Here, the semiconductor substrate has a bonding region provided on the surface thereof so as to allow another semiconductor substrate to be superposed thereon by being bonded thereto, with the connection pad formed inside the bonding region and the test pad formed outside the bonding region.

In this structure, the connection pad that is connected to the internal circuit is also connected to the test pad. Therefore, it is possible to conduct the functional testing of the semiconductor device by using the test pad and thus without causing any damage to the connection pad. Accordingly, it is possible to achieve proper bonding between the semiconductor device having undergone the functional testing and another semiconductor chip or the like.

Moreover, the test pad can be formed in a position best suited for the functional testing, and the connection pad can be formed in a position best suited for connection with another semiconductor chip or the like. This allows free setting of the positions in which connection with another semiconductor chip or the like is achieved.

In this semiconductor device according to the present invention, the connection pad may be so formed as to have a smaller size than the test pad.

This structure helps minimize the area occupied by the connection pad within the internal device region, and thus helps achieve proper connection between the semiconductor device having undergone the functional testing and another semiconductor chip or the like without sacrificing the integration density of the internal devices.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, a semiconductor device embodying the present invention will be described with reference to FIGS. 1 to 3.

Figure 1:
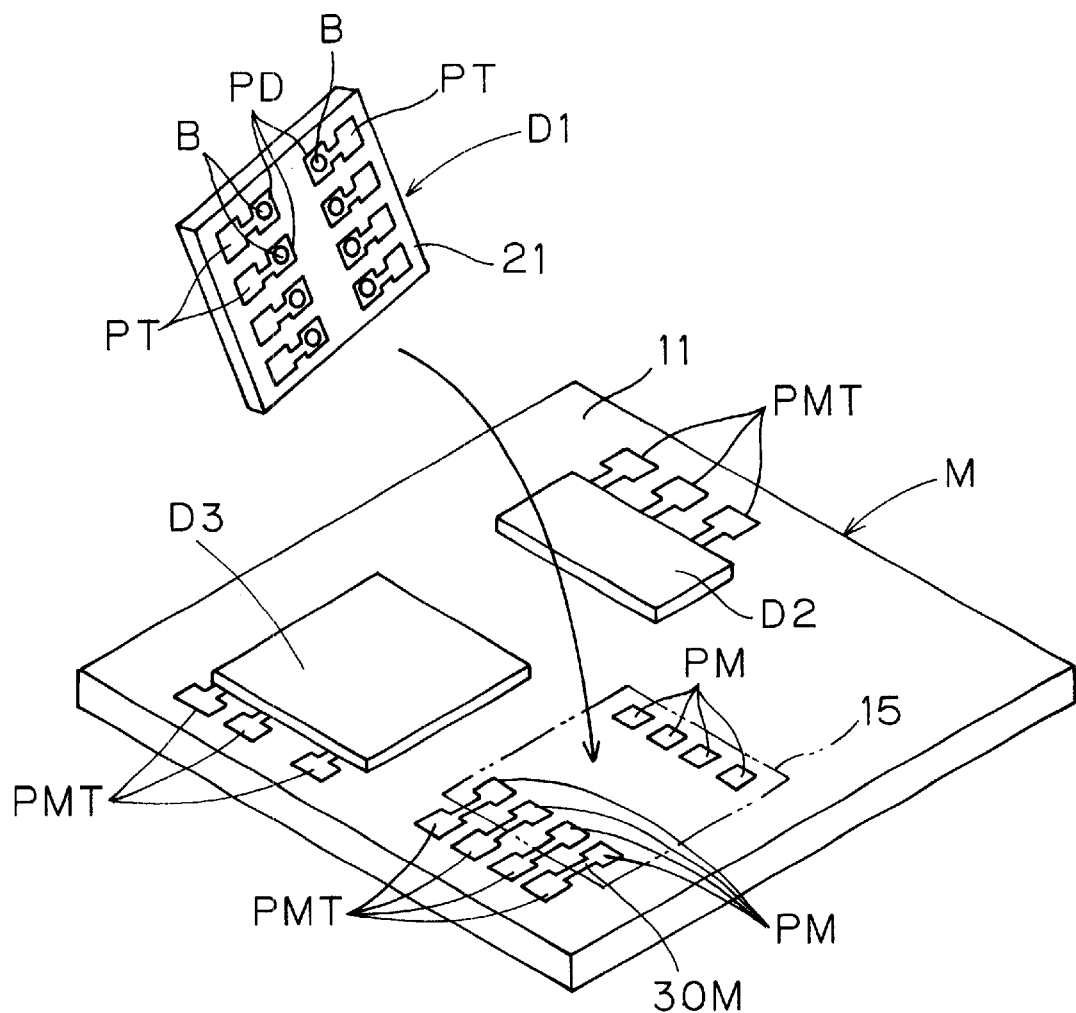
FIG. 1 is a partially exploded perspective view of the structure of a semiconductor device embodying the invention.
Figure 2:
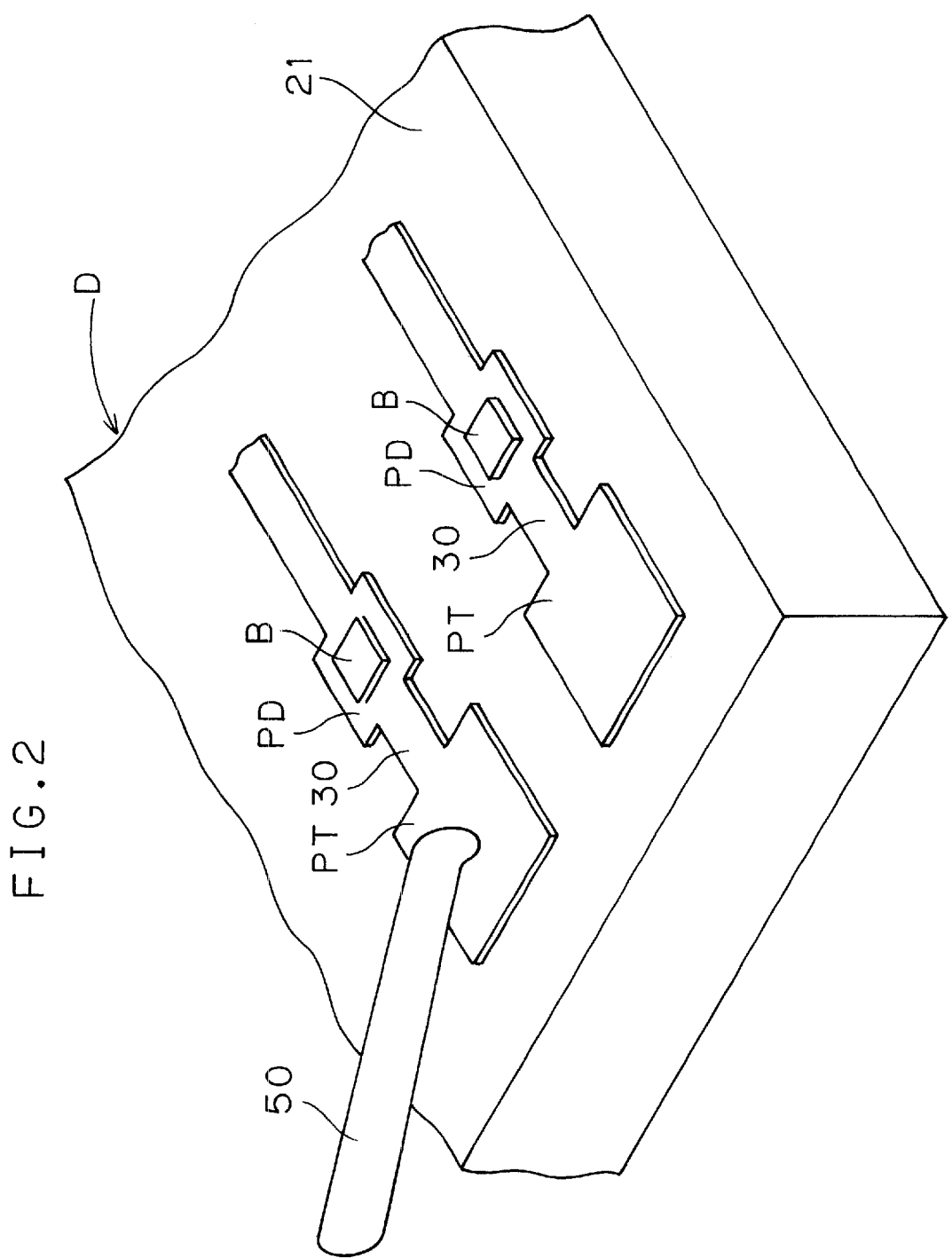
FIG. 2 is an enlarged perspective view of the structure of a portion around chip connection pads formed in the semiconductor device shown in FIG. 1.
Figure 3:
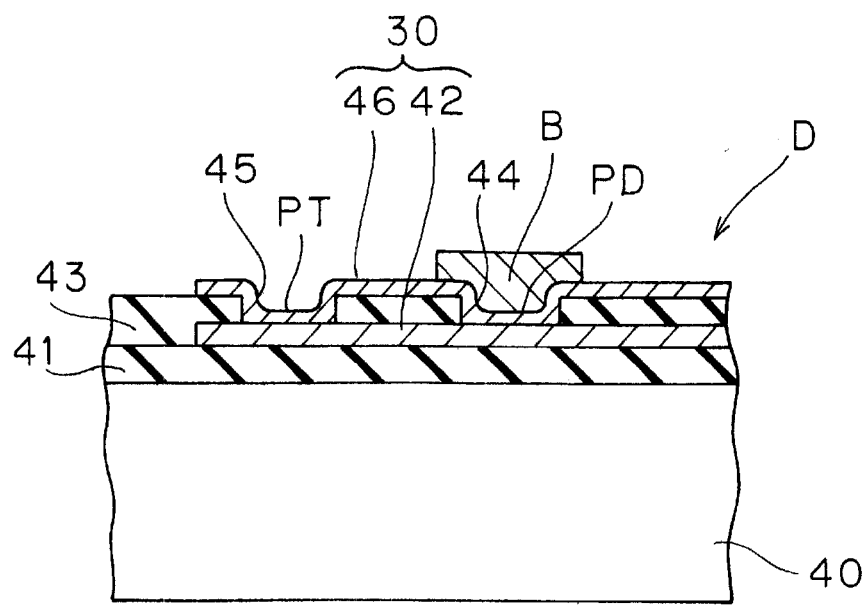
FIG. 3 is a sectional view of the structure of a portion around a chip connection pad formed in the semiconductor device shown in FIG. 1.
Figure 4:
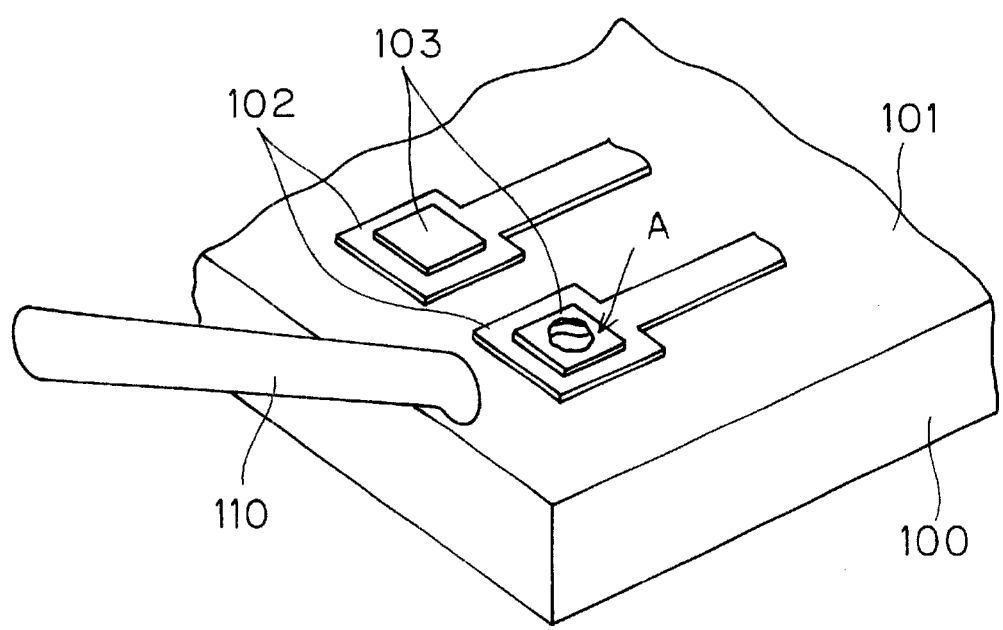
FIG. 4 is an enlarged perspective view of the structure of a portion around bumps formed on a conventional semiconductor chip.

FIG. 1 is a partially exploded perspective view of the structure of a semiconductor device embodying the invention, FIG. 2 is an enlarged perspective view of the structure of a portion around chip connection pads thereof, and FIG. 3 is a sectional view of the structure of a portion around a chip connection pad thereof.

As shown in FIG. 1, this semiconductor device has, as a first semiconductor chip, a mother chip M, and has, as a second semiconductor chip, daughter chips D1, D2, and D3 (hereafter also called "the daughter chip D" when referred to generally) individually superposed on and bonded to the surface 11 of the mother chip M. Thus, the semiconductor device has a so-called chip-on-chip structure.

The mother chip M is formed out of, for example, a silicon chip. Its surface 11, i.e. that side of the semiconductor substrate constituting the base of the mother chip M on which an active surface-layer region lies in which functional devices such as transistors are formed, is covered with an insulating protective film as the topmost layer. Above this protective film, a bonding region 15 is formed for achieving bonding to the daughter chip D (only the one corresponding to the daughter chip D1 is shown here). On this bonding region 15, a plurality of chip connection pads PM (connection pads) are arranged for achieving connection with the daughter chip D.

On the other hand, the daughter chip D is formed out of, for example, a silicon chip. The surface 21 of the semiconductor substrate constituting the base of this daughter chip D, i.e. that side thereof on which an active surface-layer region lies in which functional devices such as transistors are formed, is covered with an insulating protective film. Above this protective film, a plurality of chip connection pads PD (connection pads) are formed so as to be exposed in positions corresponding to the connection pads PM formed on the mother chip M. On these pads PD individually, bumps B (chip-to-chip or device-to-device connection members) are formed that are made of an oxidation-resistant metal such as gold, lead, platinum, silver, or iridium.

The daughter chip D is bonded to the mother chip M with the surface 21 of the former facing the surface 11 of the latter. This bonding is achieved by pressing the mother and daughter chips M and D onto each other until they are bonded together with the bumps B individually kept in contact with the chip connection pads PM formed on the bonding region 15. During this bonding, supersonic vibration is applied, as required, to the mother chip M and/or the daughter chip D to achieve secure bonding between the bumps B and the chip connection pads PM.

For example, the mother chip M has a gate array or logic circuit formed thereon. For example, the first daughter chip D1 is a CPU, the second daughter chip D2 is an A/D (analog-to-digital) conversion device, and the third daughter chip D3 is a memory device (such as a flash memory, EEPROM, ferroelectric memory, or dynamic RAM).

Moreover, the mother chip M is connected to lead frames by way of external connection pads (not shown) and bonding wires connected to those external connection pads.

On the other hand, as shown in FIG. 2, the daughter chip D has, on the surface 21 thereof, test pads PT provided in the vicinity of the chip connection pads PD. The chip connection pads PD are connected to the corresponding test pads PT by metal wiring patterns 30 so as to make pairs individually. The test pads PT are, to allow a test probe 50 to be pressed thereon easily, formed in an edge region on the surface 21 of the daughter pad D, and the chip connection pads PD are formed in a region inside this edge region on the surface 21.

Moreover, as shown in FIG. 3, over the surface of the semiconductor substrate 40 constituting the base of the daughter chip D, an insulating layer 41 is laid, and, on top of it, an aluminum wiring pattern 42 is formed that is connected to, for example, the devices (not shown) formed in the active surface-layer region of the semiconductor substrate 40. The aluminum wiring pattern 42 is coated with a protective film 43, which has openings 44 and 45 formed in the positions corresponding to the chip connection pads PD and the test pads PT. Above the protective film 43, a barrier metal film 46 (made of, for example, TiW) is formed that is kept in contact with the aluminum wiring pattern 42 in the openings 44 and 45. This barrier metal film 46 constitutes the surface-layer portions of the test pads PT and the chip connection pads PD. Thus, the portions of the barrier metal pattern 46 that lie between the test pads and the chip connection pads PD and the portions of the aluminum wiring pattern 42 that lie there together constitute the metal wiring patterns 30.

The barrier metal film 46 serves to prevent mutual diffusion of materials between adjoining films and thereby prevent the alloying of the interface.

The daughter chip D is, before being bonded to the mother chip M, singly subjected to a functional test to check the functions of the internal circuit. During this functional test, as shown in FIG. 2, a test probe 50 is pressed on the test pads PT. As required, the functional test is repeated, for example, two or three times in similar manners under different temperature conditions.

On the other hand, the mother chip M is also singly subjected to a functional test. In the mother chip M, the structure related to the chip connection pads PM, to which the test probe is electrically connected during the functional test, is the same as the structure related to the chip connection pads PD in the daughter chip D. Specifically, in the vicinity of the chip connection pads PM, to which the test probe is connected, test pads PMT are provided so as to make pairs individually, and the chip connection pads PM are connected to the corresponding test pads PMT by metal wiring patterns 30M. During the functional test, the test probe is pressed not on the chip connection pads PM but on the test pads PMT. The test pads PMT are formed in an edge region on the surface 11 of the mother chip M, and the chip connection pads PM are formed in a region inside this edge region on the surface 11 of the mother chip M.

As described above, in this embodiment, during the functional test of the mother and daughter chips M and D, in order to check the functions of the internal circuits thereof, the test probe is pressed on the test pads PMT and PT that are connected to the chip connection pads PM and PD. This eliminates the risk of damaging the chip connection pads PM of the mother chip M or the bumps B of the daughter chip D during the functional test. Thus, it is possible to prevent bad contact between the mother and daughter chips M and D when they are assembled together into a semiconductor device having a chip-on-chip structure by bonding the daughter chip D to the surface of the mother chip M. This makes it possible to achieve a satisfactory yield in the manufacture of chip-on-chip semiconductor devices.

Moreover, even if the bumps B are formed before the functional test, they do not suffer damage, and, even if they are formed after the functional test, they can be formed properly on the chip connection pads PD that have remained undamaged. Thus, the bumps B can be formed either before or after the functional test, and this makes the designing of the manufacturing process easy.

Furthermore, the bumps B can be formed on the chip connection pads PD that have remained undamaged, and therefore they do not need to be formed as unnecessarily thick films. Thus, the formation of the bumps B requires less material and time. Moreover, the bumps B can be formed not as thick films that are typically formed by electrolytic or electroless plating but thin films such as vapor-deposited metal films, and this helps save the material of the chip-to-chip connection members.

Moreover, the chip connection pads PM and PD can be formed in positions best suited for achieving connection between the mother and daughter chips M and D. This allows free setting of the positions in which the mother and daughter chips M and D are connected together, and thus ensures high accuracy of the connection positions. As a result, the connection pads that are formed in the internal device region can be formed so as to have a smaller size than the test pads. This helps reduce the area occupied by the connection pads within the internal device region, and thus makes it possible to achieve proper bonding between the semiconductor device having undergone the functional test and another semiconductor chip or the like without sacrificing the integration density of the internal devices.

On the other hand, the test pads PMT and PT can be formed in positions best suited for the functional test (for example, near the edge of the surface of the chips M and D), and this makes it possible to conduct the functional test properly.

The present invention can be carried out in any other way than it is carried out in the embodiment described above. For example, although the above-described embodiment deals with a semiconductor device having a chip-on-chip structure in which a mother chip M and a daughter chip D are connected together by bumps B or the like, it is also possible to connect a plurality of semiconductor chips together with bonding wires, and mutually connected semiconductor chips do not necessarily have to be superposed over one another. Moreover, this invention is applicable also to semiconductor devices that are used singly. Test pads may be provided also to accompany external connection pads that are connected to lead frames by wire bonding.

Moreover, although the above-described embodiment deals with a case in which bumps B are formed on a daughter chip D, it is also possible to form similar bumps on a mother chip M, or form bumps on both the mother and daughter chips M and D so that chip-on-chip bonding between the mother and daughter chips M and D will be achieved by bonding the bumps together.

Furthermore, although the above-described embodiment deals with a case in which three daughter chips D are bonded to the surface 11 of a mother chip M, it is possible to bond as many daughter chips on the surface 11 of the mother chip M as is required by the given system configuration.

Moreover, although the above-described embodiment deals with a case in which both a mother chip M and a daughter chip D are made of silicon, it is possible to use semiconductor chips made of any other material than silicon, such as gallium-arsenide or germanium, in semiconductor devices embodying the present invention. The first and second semiconductor chips may be made of either identical or different materials.

Furthermore, it is also possible to connect the chip connection pads and the test pads together not with metal wiring patterns but with polysilicon or other wiring patterns, or form bumps also on the test pads. This helps prevent corrosion, if any occurs at the test pads, from developing readily toward the connection pads.

Obviously, many modifications and variations of the present invention are possible in light of the above teachings. It is therefore to be understood that within the scope of the appended claims, the invention may be practiced other than as specifically described.

What is claimed is:

1. A semiconductor device comprising:

a semiconductor substrate;

an internal circuit formed on the semiconductor substrate;

a connection pad formed on the semiconductor substrate and connected to the internal circuit; and a test pad formed on the semiconductor substrate, connected to the connection pad for use only during functional testing of the internal circuit, and sealed in a package thereafter while a surface of the test pad is left unconnected, wherein the semiconductor substrate has a bonding region provided on a surface thereof so as to allow another semiconductor substrate to be superposed thereon by being bonded thereto, with the connection pad formed inside the bonding region and the test pad formed outside the bonding region.

2. A semiconductor device as claimed in claim 1, wherein the connection pad is so formed as to have a smaller size than the test pad.

3. A semiconductor device as claimed in claim 2, further comprising:

a device-to-device connection member formed on the connection pad so as to allow the other semiconductor substrate to be superposed on and bonded to the surface of the semiconductor substrate.

4. A semiconductor device as claimed in claim 3, wherein the test pad is formed in an edge region on the surface of the semiconductor substrate and the connection pad is formed in a region inside the edge region on the surface of the semiconductor substrate.

5. A semiconductor device having a chip-on-chip structure, comprising:

a first semiconductor substrate having a first internal circuit formed thereon;

a second semiconductor substrate having a second internal circuit formed thereon, designed to be superposed on and bonded to a surface of the first semiconductor substrate;

a connection pad each formed on the surface of the first semiconductor substrate and a surface of the second semiconductor substrate and connected to the internal circuit formed on the same semiconductor substrate; and a test pad each formed on the surface of the first semiconductor substrate and the surface of the second semiconductor substrate and connected to the connection pad formed on the same semiconductor substrate, wherein a bonding region each provided on the surface of the first semiconductor substrate and the surface of the second semiconductor substrate so as to allow the first and the semiconductor substrates to be facing, superposed on, and bonded to each other, with the connection pad formed inside the bonding region and the test pad formed outside the bonding region.

6. A semiconductor device as claimed in claim 5, wherein the connection pad is so formed as to have a smaller size than the test pad formed on the same substrate.

7. A semiconductor device as claimed in claim 6, wherein the test pad is formed in an edge region on each surface of the first and the second semiconductor substrates and the connection pad is formed in a region inside the edge region on each surface of the first and second semiconductor substrates.

8. A semiconductor device as claimed in claim 7, further comprising:

a substrate-to-substrate connection member, one formed on the connection pad of the first semiconductor substrate, or each formed on the connection pad of the first semiconductor substrate and on the corresponding connection pad of the second semiconductor substrate so as to allow the second semiconductor substrate to be superposed on and bonded to the surface of the first semiconductor substrate.

9. A semiconductor device as claimed in claim 8, wherein the substrate-to-substrate connection member is bump made of gold, lead, platinum, silver, or iridium.

* * * * *